US011728641B2

(12) United States Patent
Abu-Rejailah et al.

(10) Patent No.: US 11,728,641 B2
(45) Date of Patent: Aug. 15, 2023

(54) SYSTEM AND METHOD FOR CONTROLLING AND MONITORING PARALLEL SURGE ARRESTERS AND BUSHINGS OF A POWER TRANSFORMER AND MOTOR

(71) Applicant: Saudi Arabian Oil Company, Dhahran (SA)

(72) Inventors: Adel F. Abu-Rejailah, Dammam (SA); Thamer K. Al-Harbi, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 17/572,192

(22) Filed: Jan. 10, 2022

(65) Prior Publication Data

US 2023/0223748 A1   Jul. 13, 2023

(51) Int. Cl.
    *H02H 9/04*     (2006.01)
    *H02H 1/00*     (2006.01)

(52) U.S. Cl.
    CPC ............ *H02H 9/04* (2013.01); *H02H 1/0007* (2013.01)

(58) Field of Classification Search
    CPC .............................. H02H 9/041; H02H 9/042
    See application file for complete search history.

(56) References Cited

U.S. PATENT DOCUMENTS

| 4,577,148 A | 3/1986 | Sweetana |
| 5,532,897 A | 7/1996 | Carpenter, Jr. |
| 5,652,521 A | 7/1997 | Meyer |

(Continued)

FOREIGN PATENT DOCUMENTS

| CN | 113848437 A | 12/2021 |
| DE | 4124321 A1 | 1/1993 |

(Continued)

OTHER PUBLICATIONS

M. Koch et al., "A New Method for On-Line Monitoring of Bushings and Partial Discharges of Power Transformers", IEEE International Conference on Condition Monitoring and Diagnosis, Sep. 2012.

(Continued)

*Primary Examiner* — Jared Fureman
*Assistant Examiner* — Christopher J Clark
(74) *Attorney, Agent, or Firm* — Leason Ellis LLP

(57) ABSTRACT

An over-voltage protection system is provided for use with electrical equipment. The system includes a protection circuit having a first bus for receiving electrical power, a second bus for providing power to the equipment and two parallel surge arresters connected between the first bus and ground. A main and backup bushing are arranged in parallel between the first and second bus. The main bushing is arranged in series with a normally closed contact maintaining the main bushing in service by default. The backup bushing is arranged in series with a normally open contact isolating the backup bushing by default. The protection circuit comprises a controller for testing the insulation of the arresters and bushings. The controller is configured to selectively actuate the contacts to selectively isolate, or incorporate, the arresters and bushings in the circuit to facilitate testing and maintenance while maintaining the protection circuit operational.

16 Claims, 11 Drawing Sheets

(56) References Cited

U.S. PATENT DOCUMENTS

| | | |
|---|---|---|
| 6,927,562 B2 | 8/2005 | Anand et al. |
| 8,878,396 B2 | 11/2014 | Faxvog et al. |
| 9,322,867 B2 | 4/2016 | Chatroux et al. |
| 9,450,410 B2 | 9/2016 | Moore et al. |
| 9,557,349 B2 | 1/2017 | Kutzner et al. |
| 10,763,665 B2 | 9/2020 | Schneider et al. |
| 11,054,486 B2 | 7/2021 | Viereck et al. |
| 11,165,250 B2 | 11/2021 | Johnson et al. |
| 2011/0211290 A1* | 9/2011 | Fife .................. H02H 9/04 361/118 |
| 2012/0153976 A1* | 6/2012 | Fuechsle ............ H01T 4/04 324/750.01 |
| 2012/0239321 A1 | 9/2012 | Normoyle et al. |
| 2013/0106442 A1* | 5/2013 | Rolli ................ G01R 31/12 324/659 |
| 2020/0373755 A1 | 11/2020 | Hafner |
| 2021/0083468 A1 | 3/2021 | Guo |

FOREIGN PATENT DOCUMENTS

| | | |
|---|---|---|
| EP | 3211644 A1 | 8/2017 |
| WO | 2008113142 A2 | 9/2008 |
| WO | 2018055547 A1 | 3/2018 |
| WO | 2018173066 A1 | 9/2018 |

OTHER PUBLICATIONS

B. Mohseni et al., Abstract—"Condition Assessment of Power Transformer Bushing Using SFRA and DGA as Auxiliary Tools", IEEE International Conference on Power System Technology, Sep. 2016.

W. Doorsamy et al., "Condition Monitoring of Metal-oxide Surge Using Leakage Current Signal Analysis", IEEE International Conference on High Voltage Engineering and Application, Sep. 2018.

LV Badicu et al., Abstract—"Detection of Bushing Insulation Defects by Diagnostic Monitoring", IEEE International Conference on Condition Monitoring and Diagnosis, Sep. 2016.

IA Metwally et al, Abstract—"Online Condition Monitoring of Surge Arresters Based on Third-Harmonic Analysis of Leakage Current", IEEE Transactions on Dieelectrics and Electrical Insulation, Sep. 2017.

International Search Report and Written Opinion in corresponding PCT Application No. PCT/US2023/060367, dated May 16, 2023; 12 pages.

Rene Seeberger; Capacitance and Dissipation Factor Measurmnets; IEEE Electrical Insulation Magazine, IEEE USA, vol. 2, Jan. 1, 1986.

\* cited by examiner

| # | PLC1 (131) | C1 Status | C2 Status | Event Type | PLC2 (132) | C5 Status | C6 Status | PLC3 (133) | C11 Status | C12 Status | Event Type |
|---|---|---|---|---|---|---|---|---|---|---|---|
| 1 | [output1 - output4], [0, 0] | Closed | Closed | Two Surge arrestors are healthy and in service. | [output1 - output4], [0, 0] | Closed | Opened | [output1 - output2], [0, 0] | Closed | Opened | The Bushings are healthy. The main bushing is in service and the backup bushing is out of service in standby. |
| 2 | [output1 - output4], [1, 0] | Opened | Closed | Surge arrestor A is under test or isolated for insulation failure and surge arrestor B is healthy and in service. | [output1 - output4], [1, 1] | Opened | Closed | [output1 - output2], [1, 1] | Opened | Closed | Main bushing is under test or isolated for insulation failure and backup bushing is healthy and in service. |
| 3 | [output1 - output4], [0, 1] | Closed | Opened | Surge arrestor B is under test or isolated for insulation failure and surge arrestor A is healthy and in service. | [output1 - output4], [0, 1] | Closed | Opened | [output1 - output2], [0, 1] | Closed | Opened | Backup bushing is under test or isolated for insulation failure and main bushing is healthy and in service. |
| 4 | [output1 - output4], [1, 1] | Opened | Opened | Both surge arrestors have insulation failure. The transformer/motor will be shut down automatically | [output1 - output4], [1, 0] | Opened | Opened | [output1 - output2], [1, 0] | Opened | Opened | Both bushings have insulation failure. The transformer/motor will be shut down automatically. |

FIG. 4

|                  |   | |
|------------------|---|---|
| Surge arrestor A | ☒ | Healthy & in service |
| Surge arrestor B | ☒ | Under Tan Delta Test |
| Main Bushing     | ☒ | Healthy & in service |
| Back up bushing  | ☑ | Healthy & out of service |

Last Insulation Test

|                    | Result | Device    | Target |
|--------------------|--------|-----------|--------|
| Surge arrestor A : | 0.02   | Tan Delta | < 0.5  |
| Surge arrestor B : | 0.04   | Tan Delt  | < 0.5  |
| Main Bushing :     | 60MΩ   | IR Test   | > 32MΩ |
| Back up bushing :  | 60MΩ   | IR Test   | > 32MΩ |

FIG. 6

SYSTEM AND METHOD FOR CONTROLLING AND MONITORING PARALLEL SURGE ARRESTERS AND BUSHINGS OF A POWER TRANSFORMER AND MOTOR

FIELD OF THE DISCLOSURE

The present disclosure relates generally to an over-voltage protection systems for use with electrical equipment, and more particularly to an over-voltage protection circuit having parallel surge arresters and bushings and circuitry for controlling and monitoring the parallel surge arresters and bushings of a power transformer or motor.

BACKGROUND OF THE DISCLOSURE

Surge arresters and bushings are commonly used in the switchgear for powering electrical equipment, such as transformers and motors. A bushing is an insulating structure that facilitates the passage of an energized, current-carrying conductor through a grounded conducting barrier, such as the case of a transformer or circuit breaker. A surge arrester is a protective device for limiting voltage on the equipment by discharging or bypassing excessive energy transients, which might be caused by power spikes from a power grid and lightning.

A significant percentage of unnecessary power transformer and motor "trips" result from a failure of the insulation of surge arrester(s) or bushing(s) used in the switchgear. These events can cause unnecessary down time, reduce equipment longevity and increase costs.

It is in regard to these and other problems in the art that the present disclosure is directed to provide a technical solution for effective protection of electrical equipment from surges and monitoring the health of the protection circuits.

SUMMARY OF THE DISCLOSURE

According to an embodiment, an over-voltage protection system for protecting electrical equipment from over-voltage transients from a power source is provided. The system comprises a protection circuit comprising a first electrical bus which is energized by the power source and a second electrical bus configured to feed power to the electrical equipment. The protection circuit also includes a first surge arrester and a second surge arrester arranged in parallel. The first surge arrester has one end electrically connected to the first electrical bus via first normally closed contact and an opposite end connected to ground. Similarly, the second surge arrester has one end electrically connected to the first electrical bus via a second normally closed contact and an opposite end connected to ground.

The protection circuit also includes a main bushing and a backup bushing, wherein the main bushing is connected between the first electrical bus and the second electrical bus by a third normally closed contact and the backup bushing is connected between the first electrical bus and the second electrical bus by a first normally open contact. More specifically, the first normally open contact is provided in series with the bushing and it is configured to isolate the backup bushing from at least one of the first electrical bus and the second electrical bus while in an open state, and electrically connect the backup bushing to the one or more of the first electrical bus and the second electrical bus when in a closed state.

The protection circuit also includes a controller configured to selectively open or close one or more of the first normally closed contact, the second normally closed contact, the third normally closed contact, and the first normally open contact. Additionally, the controller is configured to: selectively isolate the first surge arrester and thereby remove it from service in the protection circuit by opening the first normally closed contact; selectively isolate the second surge arrester and thereby remove it from service in the protection circuit by opening the second normally closed contact; selectively isolate the main bushing and thereby remove it from service in the protection circuit by opening the third normally closed contact; and selectively place the backup bushing into service in the protection circuit by closing the first normally open contact thereby electrically connecting the backup bushing to the first electrical bus and the second electrical bus.

According to a further aspect, a method of protecting electrical equipment from over-voltage transients from a power source using an over-voltage protection system is provided.

The method includes the step of providing a protection circuit a first electrical bus which is energized by the power source and a second electrical bus configured to feed power to the electrical equipment. The protection circuit also includes a first surge arrester and a second surge arrester arranged in parallel. The first surge arrester has one end electrically connected to the first electrical bus via first normally closed contact and an opposite end connected to ground. Similarly, the second surge arrester has one end electrically connected to the first electrical bus via a second normally closed contact and an opposite end connected to ground. The protection circuit also includes a main bushing and a backup bushing, wherein the main bushing is connected between the first electrical bus and the second electrical bus by a third normally closed contact and the backup bushing is connected between the first electrical bus and the second electrical bus by a first normally open contact. More specifically, the first normally open contact is provided in series with the bushing and it is configured to isolate the backup bushing from at least one of the first electrical bus and the second electrical bus while in an open state, and electrically connect the backup bushing to the one or more of the first electrical bus and the second electrical bus when in a closed state. The protection circuit also includes a controller configured to selectively open or close one or more of the first normally closed contact, the second normally closed contact, the third normally closed contact, and the first normally open contact. The protection circuit also includes a tan delta tester operatively connected to the controller and configured to test an insulation property of one or more of the first surge arrester and the second surge arrester, and an Insulation Resistance (IR) tester operatively connected to controller and configured to test an insulation property of one or more of the main bushing and the backup bushing.

The method also includes the step of periodically measuring, by the controller using the tan delta tester, the insulation property of each of the first and second surge arresters individually. Measuring the insulation property of a given surge arrester among the first surge arrester and second surge arrester includes isolating the given surge arrester from the protection circuit, and maintaining the other surge arrester in service in the protection circuit while the given surge arrester is isolated. More specifically, the first surge arrester is isolated by opening the first normally closed contact and the second surge arrester is isolated by opening the second normally closed contact. The measuring step also includes, measuring, by the controller using the tan delta tester, the insulation property of the given surge arrester.

The method further comprises the step of determining, by the controller, a status of the given surge arrester's insulation based on the measured insulation property. In response to determining that the status of the given surge arrester's insulation is acceptable the method includes, the steps of placing the given surge arrester back into service, wherein the first surge arrester is placed back into service by closing the first normally closed contact, and wherein the second surge arrester is placed back into service by closing the second normally closed contact. In response to determining that the status of the given surge arrester's insulation is poor, the method further comprises the steps of outputting, by the controller, an alarm indicating the status of the given bushing, and maintaining the given surge arrester in an out of service state.

These and other aspects, features, and advantages can be appreciated from the accompanying description of certain embodiments of the disclosure and the accompanying drawing figures and claims.

BRIEF DESCRIPTION OF THE DRAWINGS

FIG. 4 is a state table associating the status of the surge arresters and bushings and the state of contacts and controllers of the protection circuit of FIG. 2A, according to an embodiment.

FIG. 6 depicts a screen shot of an exemplary display screen outputting information concerning operation of the protection circuit of FIG. 2A, according to an embodiment.

It is noted that the drawings are illustrative and not necessarily to scale, and that the same or similar features have the same or similar reference numerals throughout.

DETAILED DESCRIPTION OF CERTAIN EMBODIMENTS OF THE DISCLOSURE

Figure 1:
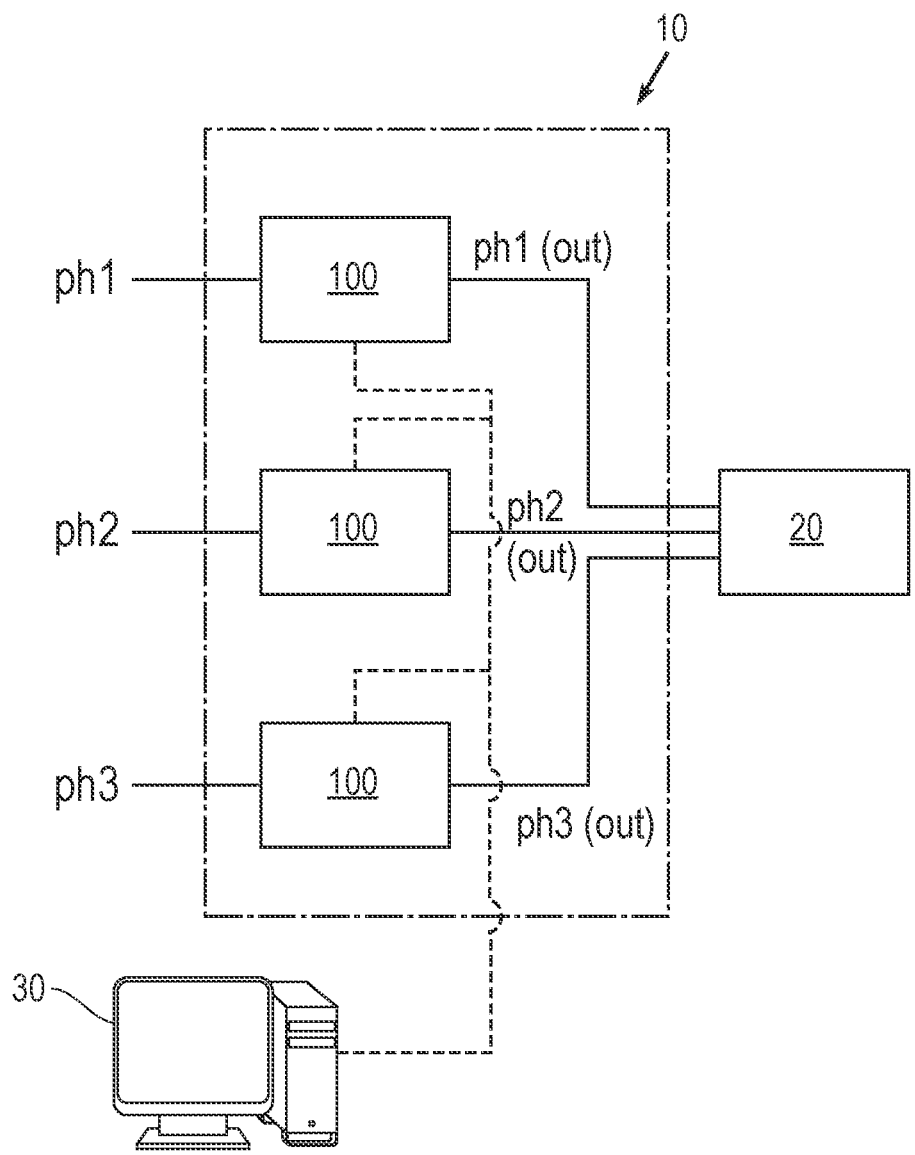
FIG. 1 is a block diagram illustrating a non-limiting example of an electrical system provided with an over-voltage protection solution, according to an embodiment.

In various example embodiments, an over-voltage protection system is provided for use with electrical equipment such as a power transformer or motor. The protection system includes at least one protection circuit comprising two surge arresters arranged in parallel and two parallel electrical bushings, among other components for monitoring and control of the surge arresters and bushing. In an embodiment, one such protection circuit is located in series with each phase input to the equipment, to absorb electrical surges before entering the equipment.

Embodiments of the protection circuit are configured solve a significant percentage of unnecessary power transformers and motor trips resulting from a failure of the insulation of surge arrester(s) and bushing(s). In particular, the protection circuit aims to mitigate the insulation failure of surge arresters and bushings. In this regard, the protection circuit is configured for monitoring, analyzing, and controlling the use of the surge arresters and bushings in the protection circuit and reporting any detected insulation failures. Benefits of the protection circuit include increasing the reliability of the transformer or motor, improving safety by isolating any defective surge arrester and/or bushing and reporting the status of the insulation of the surge arresters and bushings with alarms, thereby maintaining equipment longevity and avoiding maintenance costs. The protection circuit uses a novel configuration and arrangement of internal components to provide a solution for keeping any power transformer or motor in a reliable operational state.

In an embodiment, the protection circuit comprises at least two surge arresters that are connected in parallel to a given phase. This arrangement can increase the life of the surge arresters because any over-voltage will be absorbed by the two parallel surge arresters. In other words, the total over-voltage value is divided among the surge arresters and the resulting mechanical strength on each surge arrester will be lower than traditional configurations which use a single surge arrester per phase. Additionally, the protection circuit comprises a particular bushing configuration in which at least two bushings are connected to each phase in parallel, and one bushing is utilized as a main bushing and another bushing is segregated by a normally open contact, as the second bushing is intended to be used as backup and not in active service unless necessary.

The protection circuit can also comprise a monitoring component configured to automatically perform insulation testing for each of the surge arresters and bushings. The result of the testing can, in some embodiments, be displayed on an LCD display provided on a junction box for housing the system in the field, provided in the substation and/or provided at a remote monitoring station. Additionally, the protection circuit can be configured to shut down the equipment (e.g., the power transformer and/or motor) in response to various triggering events that are further described herein.

FIG. 1 is a conceptual system diagram illustrating a non-limiting example of an electrical system 1 provided with an over-voltage protection solution 10 according to the principles of the disclosure. As shown in FIG. 1 the system 1 includes electrical equipment 20, which can include, for example and without limitation, a transformer or motor. In this example, the electrical equipment is powered by three phase AC power, wherein one or more conductors carrying a respective phase among the three phases are referenced by ph1, ph2 and ph3. Additionally, the protection solution 10 comprises a protection circuit 100 arranged in series with each power phase input to the equipment 20. More specifically, in the exemplary application requiring three phase power, the solution 10 comprises three protection circuits 100 wherein each protection circuit receives a respective phase, and provides the respective phase to the electrical equipment 20 via one or more conductors. Although the protection circuits 100 are shown as being directly connected to the electrical equipment 20 the connection is not limited to a direct connection. Additionally, it should be understood that terms "connected" or "coupled" can include direct electrical connections or indirect connections via one or more intervening components, circuits and the like. Furthermore, the protection circuits 100 can each be in wired or wireless data communication with a local and/or remote monitoring station 30, either directly or over a data communication network (not shown).

Figure 2A:
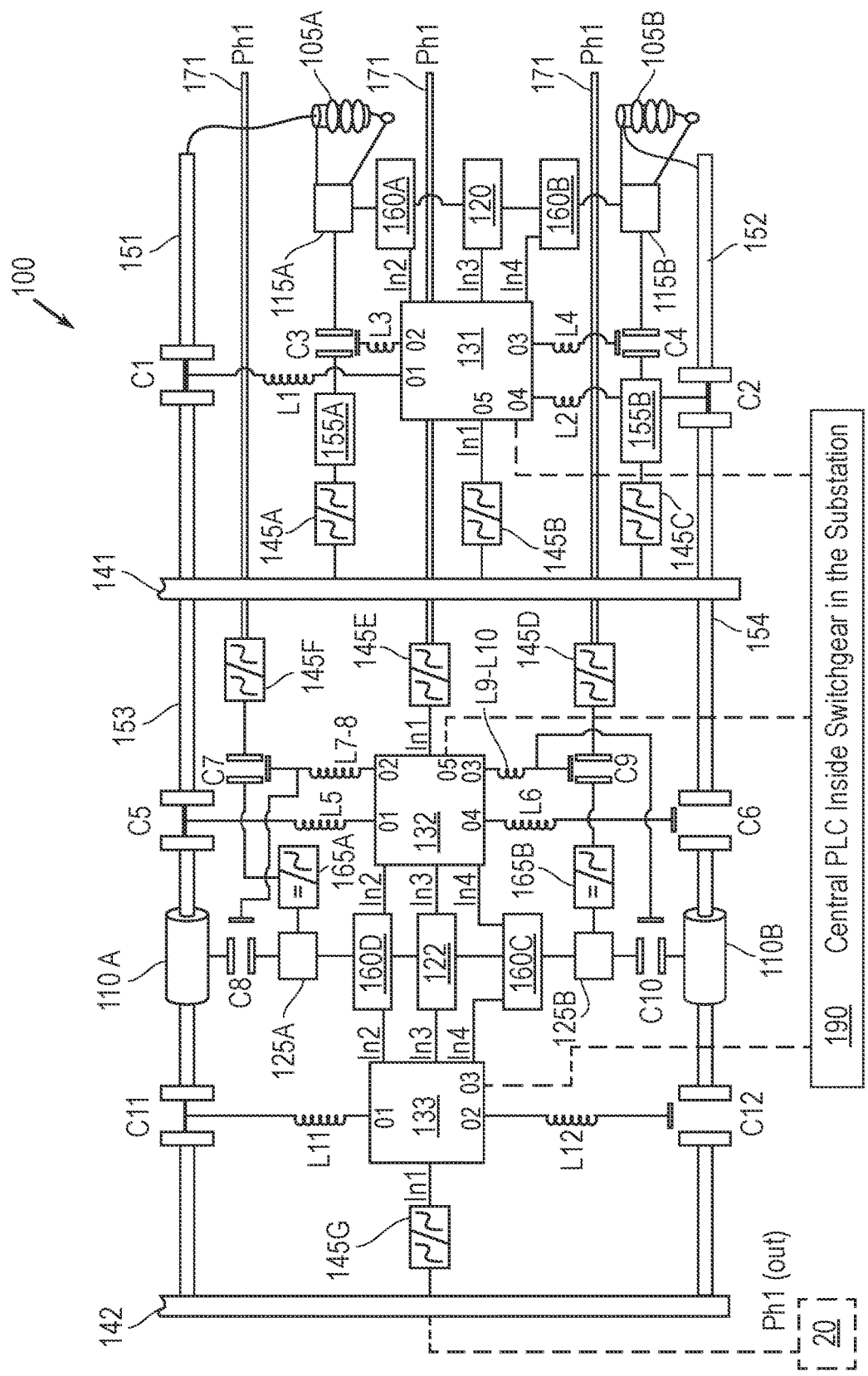
FIG. 2A is a circuit diagram of an exemplary protection circuit for use in the over-voltage protection system of FIG. 1, according to an embodiment.

FIG. 2A is a circuit diagram illustrating an exemplary configuration of the protection circuit 100 of system 1 according to an embodiment, particularly, the protection circuit 100 arranged in series with phase ph1. The protection circuit 100 comprises two surge arresters, 105A and 105B, which are arranged in parallel. Additionally, two electrical bushings 110A and 110B, are also generally arranged in parallel. In particular, the first bushing 110A is considered the main bushing intended to be actively in service in the protection circuit 100, as a default. The second bushing 110B is arranged as a backup bushing that is electrically connected to the protection circuit when the main bushing is disconnected for testing, service and the like. In particular, bushing 110B is electrically isolated from the circuit during normal operation by normally open contacts, C6 and C12. Contacts C6 and C12 are configured to be closed by local programmable logic circuit (PLC) PLC 132 and PLC 133, respectively, in the event the main bushing 110A fails or is disconnected for testing.

The protection circuit 100 further comprises testing and monitoring circuitry for measuring insulation properties for both of the surge arresters and both of the bushings. In an embodiment, the protection circuit 100 is configured to perform insulation tests for each surge arrester using a respective "Tan Delta" tester 115A and 115B. Additionally, a temperature sensor 120 can be provided to measure ambient temperature at the surge arresters, which is used to correct temperature-dependent variation in the Tan Delta insulation test measurements. Additionally, the protection circuit can be configured to perform insulation tests for each bushing 110A and 110B using a respective Insulation Resistance (IR) tester 125A and 125B. Additionally, a temperature sensor 122 can be provided to measure ambient temperature at the bushings, which is used to correct temperature-dependent variations in the IR test measurements.

The protection circuit can comprise one or more local controllers, such as PLCs, where live data is gathered for further analysis, monitoring and output. In particular, a first local PLC 131 can be provided to monitor the Tan Delta and temperature measurements and perform the insulation tests on the surge arresters 105A and 105B. Additionally, a second and third local PLC, 132 and 133 can be provided to monitor the IR test measurements and perform the insulation tests of the bushings 110A and 110B. In short, the protection circuit can comprise IR testers, Tan Delta testers, converters, PLCs, temperature sensors, stepdown transformers, electrical contacts and frequency converters, as described herein.

In an embodiment, the one or more controllers of the protection circuit 100 can be in communication with a central monitoring computing device 190. More specifically, as shown in FIG. 2A, output 5 of PLCs 131 and 132 and output 3 of PLC 133 can be configured to output data captured by respective local PLCs to the central PLC 190 inside the substation.

The testing results and other information relating to the status of the protection circuit 100 can be output using a display such as an LCD display 196 (FIG. 2B-2C) that is operatively connected to the central PLC 190. Central PLC 190 represents one or more controller devices that can be located in the switchgear of the over-voltage protection system 10. In addition or alternatively monitoring information can be displayed on an LCD 192 (FIG. 2B-2C) of a remote monitoring system 30 (FIG. 1) that is connected to central PLC 190 and monitoring the three protection circuits 100.

The central PLC 190 can also be configured to open or close a main breaker (not shown) of the system 1 inside the switchgear in the event of failures in two surge arresters or in two bushings requiring a system shutdown.

In an embodiment, the protection circuit 100 comprises an arrangement of electrical buses for conducting the power received from the power source, including, a first vertical bus 141, a second vertical bus 142, a first horizontal bus 151, a second horizontal bus 152, a third horizontal bus 153 and fourth horizontal bus 154, which can be arranged as shown in FIG. 2A. Additionally, the protection circuit can comprise seven (7) stepdown transformers 145A-145G, two frequency converters 155A-155B, and two AC to DC voltage converter 165A-165B. Additionally, the protection circuit can comprise four (4) microcontrollers 160A-160E. Additionally, the protection circuit comprises ten (10) coils with twelve (12) contacts C1-C12. The opening and/or closing of contacts C1-C12 can be controlled using the local PLCs 131, 132 and 133. In an embodiment, the coils can be an inductor of a relay. However, coils can represent any other suitable device for selectively opening or closing one or more electrical contacts in response to a signal output by a PLC.

The protection circuit 100 includes components configured to control operation of the surge arresters according to a solution described next. The control components of the protection circuit 100 are configured to selectively implement various configurations of the vertical and horizontal busses to facilitate isolation and testing of individual surge arresters and busses while otherwise keeping the protection circuit in an operational state (i.e., feeding power to the equipment while still providing over-voltage protection). The vertical busses 141 and 142, and horizontal busses 151, 152, 153 and 154 are connected together through electrical contacts C1 and C2, and these contacts are normally closed. The two surge arresters 105A and 105B are connected to horizontal bus 151 and 152, respectively, though a respective cable connected to a respective first end of the respective surge arrester. The opposite ends of the surge arresters are grounded.

In the illustrated example, the voltage of the system 1 is equal or greater than 34.5 KV and as such, the protection circuit 100 comprises multiple power inputs that each receive power via respective cables (i.e., three cables 171) from the source (e.g., power grid) having the same/single phase. However, it should be understood the protection solution is applicable to all voltage levels. As shown, the three cables 171 are connected directly to vertical bus 141 and thereby energizing vertical bus 141 when in operation. As a result of the configuration of surge arresters and the vertical bus 141, if there an overvoltage came from any disturbance in the power grid or from lightning and the like, it will be absorbed by the two parallel surge arresters 105A and 105B.

In an embodiment, the protection circuit 100 is configured to conduct an insulation test on the surge arresters 105A and 105B at regular time intervals (e.g. every month). The insulation test can be conducted on the surge arresters 105A and 105B using the Tan Delta testers 115A and 115B, respectively. The Tan Delta tester can output the result in the form of a ratio of the resistance of the surge arrester divided by its capacitance. Preferably, the protection circuit 100 is configured to test the insulation of the surge arresters individually, and at different times to keep the protection circuit operational during testing, thereby dividing the insulation test process into two steps performed at different times.

In an embodiment, the protection circuit 100 is configured to control operation of the bushings 110A and 110B according to a solution described next. As shown in FIG. 2A, there are two bushings, the main bushing 110A and a backup bushing 110B. The main bushing 110 is connected to the horizontal bus 153 through two contacts C5 and C11. These contacts are normally closed such that, as a default during normal operation, power flows from the first vertical bus 141, through contacts C5 and C11 (and the main bushing 110A), to energize the vertical bus 142. The vertical bus 142 is the bus that is intended to feed the power to the equipment 20 such as the windings of a transformer or motor.

The backup bushing 110B can also be connected to the vertical bus 141, via horizontal bus 154, through two contacts C6 and C12. In particular, contacts C4 and C6 can be normally open contacts that, as a default, electrically isolate the backup bushing 110B from the protection circuit 100 during normal operation. Contacts C6 and C12 can be configured to be closed when the backup bushing 110B is put into service, say, when the main bushing 110A is isolated for testing or for maintenance purposes. Accordingly, although the backup bushing 110B is generally described as being arranged in parallel with the main bushing, it should be understood that the backup bushing can be electrically isolated from the protection circuit as a default during normal operation of the main bushing 110A.

Additionally, in an embodiment, the protection circuit is configured to conduct an insulation test on the bushings 110A and 110B at regular time intervals (e.g. every month). The insulation test can be conducted on the bushings 110A and 110B using the insulation resistance (IR) testers 125A and 125B, respectively. The IR tester measures the total resistance between any two points and is configured to determine how effective the dielectric (insulation) is in resisting the flow of electrical current. As such, the IR tester does not measure the ratio between resistance and capacitance; the output of the IR test performed by the IR tester is a resistance expressed in MΩ. For your information, the output of the IR tester is connected to the electrical contact C8, as shown in FIG. 2A.

Figure 2B:
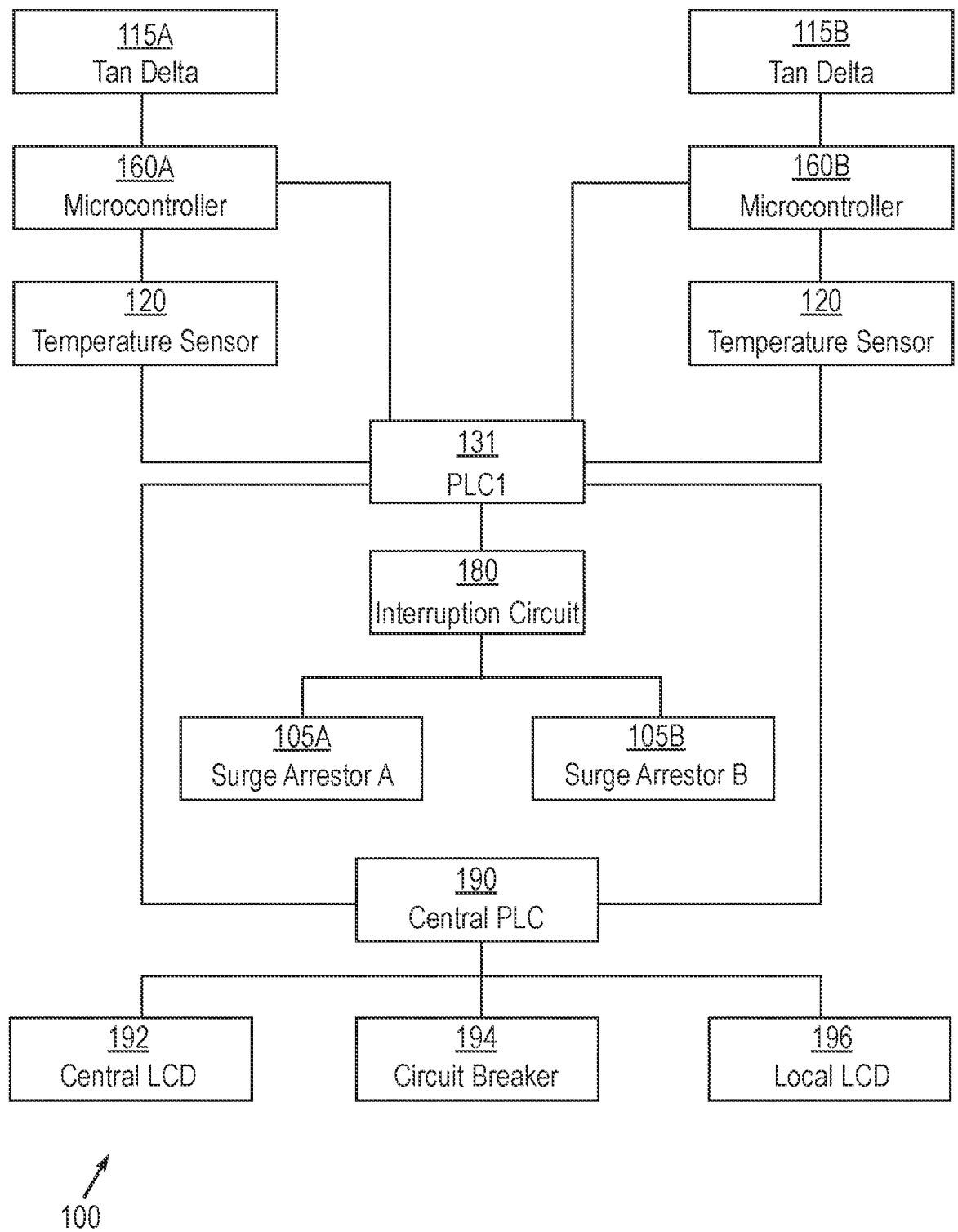
FIG. 2B is a conceptual block diagram of an exemplary configuration of protection circuit of FIG. 2A demonstrating the communication between the surge arresters and components for operating and monitoring the surge arresters, according to an embodiment.
Figure 2C:
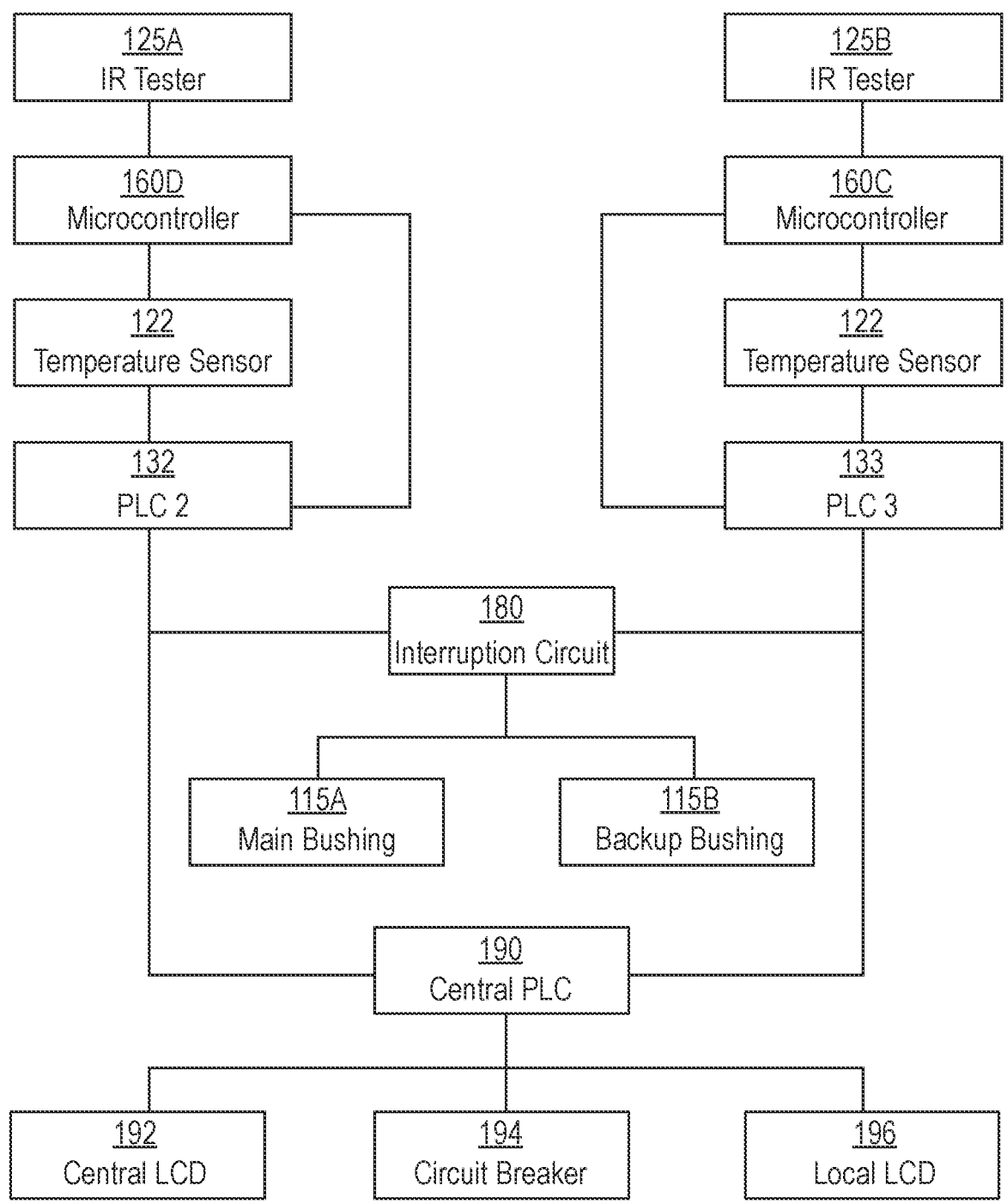
FIG. 2C is a conceptual block diagram of an exemplary configuration of the protection circuit of FIG. 2A demonstrating the communication between the bushings and components for operating and monitoring the bushings, according to an embodiment.

FIG. 2B is a conceptual block diagram of an embodiment of the protection circuit 100 demonstrating the communication between the surge arresters and other main components used for monitoring and operating the surge arresters. FIG. 2C is a conceptual block diagram of an embodiment of the protection circuit 100 demonstrating the communication between the bushings and other main components used for monitoring and operating the bushings. As shown in FIGS. 2B-2C, in an embodiment, the protection circuit further comprises interruption circuitry 180 operatively controlled by the central PLC 190 and configured shut down the equipment 20 in the event of a failure. Furthermore, as noted, the central PLC 190 can also be configured to open or close a main breaker 194 of the over-voltage protection system 10 inside the switchgear in the event of failures in two surge arresters or in two bushings requiring a system shutdown.

In an embodiment, the protection circuit 100 is configured to test operation of the surge arrester 105A according to an exemplary process described next. More specifically, the protection circuit is configured to isolate the surge arrester 105A for testing by opening the first contact C1, which can be achieved by energizing the coil L1 that is connected to PLC 131 via its first output O1. Local PLC 131 is configured to output via output O1 a logic high value (also referred to as "one" (1)), which will energize the connected coil L1 and open the normally closed contact C1. After that, PLC 131 is configured to output a logic high from output O2 of PLC 131, which will energize the connected coil L3 so as to close the normally open contact C3. Once C3 is closed, the stepdown transformer 145A will output a signal to the frequency converter 155A, which lowers the frequency, say, from 60 HZ to 0.1 or 0.01 HZ. The signal input to the Tan Delta tester 115A via contact C3 triggers the Tan Delta tester to start the insulation test on surge arrester 105A. In the exemplary embodiment, the applied voltage for the exemplary Tan Delta testers (e.g., 115A and 115B) is an AC signal having a very low frequency, say, from 0.01 HZ to 0.1 HZ. As such, a suitable frequency converter (e.g., 155A and 155B) can be used.

The result of the insulation test will be recorded in the microcontroller 160A and the microcontroller 160A will provide the results to the PLC 131 through its input IN2. PLC 131 is configured be fed power from stepdown transformer 145B, which is connected to a voltage port IN1 of PLC 131. Additionally, during the test, the temperature sensor 120 is configured to measure the ambient temperature at the surge arrester and the result is sent to PLC 131 through its input port, IN3. The result measured by the temperature sensor 120 can also be provided to the microcontroller 160A. Based on the ambient temperature value a correction factor can be chosen by the PLC 131. The result of the Tan Delta test can be multiplied by the correction factor and compared with setup values or other such criteria to determine whether the insulation of surge arrester 105A is sufficiently good or is poor. In an embodiment, all mathematical analysis steps are performed by PLC 131.

The protection circuit 100 is configured to subsequently test operation of the surge arrester 105B according to an exemplary process described next. In an embodiment, after testing surge arrester 105A, the surge arrester 105A can be returned back into service if it passed the test. Provided surge arrester 105A is in operation, the surge arrester 105B can be isolated for testing by opening normally closed contact C2. The PLC 131 can be configured to open contact C2 by energizing the connected coil L2 through output O4 of PLC 131. After that, the PLC 131 can be configured to output a logic high through output O3 of PLC 131, which will energize the connected coil L4 so as to close the normally open contact C4. Once C4 is closed, the stepdown transformer 145C AC signal output will pass through the frequency converter 155B, which changes the frequency, say, from 60 HZ to 0.1 or 0.01 HZ. The output of the converter 155B passing through closed contact C4 to Tan Delta tester 115B can trigger the Tan Delta tester 115B to start the insulation test on surge arrester 105B.

The result of the insulation test of surge arrester 105B can be recorded in the microcontroller 160B and the microcontroller 160B can provide the results to the PLC 131 through its input IN4. Similar to the test of arrester 105A, the temperature sensor 120 can be configured to measure the ambient temperature and the result is sent to PLC 131 through its input IN3. Based on the ambient temperature value, a correction factor can be chosen by the PLC 131. The result of the Tan Delta test can be multiplied by the correction factor and compared with setup values or other such criteria to determine whether the insulation of surge arrester 105B is sufficiently good or is poor.

Table 1, shown below, illustrates three exemplary scenarios depending on the measured value X of the Tan Delta test, the corresponding health of the tested surge arrester (e.g., arrester 105A or 105B) as determined by the PLC 131 based on the Tan Delta test result. Table 1 also specifies further action(s) that would be performed or initiated by the PLC 131 in connection with a respective scenario.

TABLE 1

| # | Tan Delta Test | Surge Arrester Healthiness | Action Taken |
|---|---|---|---|
| 1 | X < 0.5 | Good | Display in the central & local LCD: "Surge Arrester A/B Insulation is Good and ready to go back into service" |
| 2 | X = 0.5 | Questionable (Deterioration case) | Display in the central & local LCD: "Surge Arrester A/B Insulation need to be checked again" Tan Delta test will be again conducted automatically to determine whether there is an error in the measurements. If the second test value is equal to 0.5, the tested surge arrester will be isolated from the circuit and the PLC will indicate an alarm condition in the central & local LCD. |
| 3 | X > 0.5 | Poor | Display in the central & local LCD: "Surge Arrester# A/B Insulation is poor" Surge arrester under testing will be directly isolated from the circuit until it is replaced by new one and the PLC will indicate an alarm condition in the central & local LCD. |

The protection circuit 100 is configured to test operation of the main bushing 110A according to an exemplary process described next. Testing of the insulation of the main bushing 110A can be divided in two steps that are performed at different times. In the first step, the main bushing will be isolated by opening the contacts C5 and C11. This step can be achieved by PLC132 energizing the coil L5 that is connected to PLC 132 through its output O1, and energizing the coil L11 that is connected to PLC 133 through its output O1. For energizing these coils, values of O1 of PLC 132 and O1 of PLC 133 can be set to logic high/one so as to open the normally-closed contacts C5 and C11, respectively. In the second step, the O2 of PLC 132 can be set to logic high/one in order to energize the connected coil L7-8 in order close the associated contacts C7 and C8. Once these contacts are closed, the stepdown transformer 145F output will go to the converter 165A, which is configured to change the AC voltage to a DC voltage in order to initialize the Insulation Resistance (IR) tester 125A, making it ready to start the insulation test on the main bushing 110A. Because, in the exemplary embodiment, the applied voltage for the IR testers (e.g., 125A or 125B) is DC, an appropriate AC to DC voltage converter (e.g., 165A and 165B) can be used.

The result of the Tan Delta insulation test can be recorded in the microcontroller 160D. The microcontroller 160D can provide the results to PLC 132 through its input port IN2 and similarly, can provide the result to PLC 133 through its input port IN2. PLC 132 is configured to be fed power via the stepdown transformer 145E, which is connected to voltage port IN1 of the PLC 132 and vertical bus 141. Similarly, PLC 133 is configured to be fed power via the stepdown transformer 145G, which is connected to voltage port IN1 of the PLC 132 and vertical bus 142.

Additionally, during the test, the temperature senor 122 is configured to measure the ambient temperature and the result will be sent to PLC 132 through its IN3 input, and to PLC 133 through its IN3 input. Based on the ambient temperature value, PLCs 132 and 133 are configured to choose a correction factor. The result of the IR test can be multiplied by the correction factor and compared with setup values or other such criteria to determine whether the insulation of the main bushing 110A is sufficiently good or is poor. All mathematical analysis can be performed by the PLC 132 and PLC 133.

The protection circuit 100 is configured such that, while the main bushing 110A is isolated for testing or maintenance purposes, the backup bushing 110B is involved in the protection circuit instead of the main bushing by closing the contacts C6 and C12. These contacts, C6 and C12, are normally opened but they are closed when the main bushing is under test or maintenance. In particular, once the main bushing 110A is isolated, the output O4 of PLC 132 and output O2 of PLC 133 can be set to energize the connected coils L6 and L12 and thereby close contacts C6 and C12, respectively. If the main bushing 110A passes the test the main bushing can be retuned into service and the backup bushing can be isolated.

The protection circuit 100 can configured to test operation of the backup bushing 110B according to an exemplary process described next. Testing insulation of the backup bushing 110B, is generally simpler than testing the main bushing 110A because the backup bushing is normally isolated. In particular, the test can start by PLC 132 setting its output O3 in order to energize the coil L9-10 that is connected thereto and close the associated contacts C9 and C10. Once contacts C9 and C10 are closed, the stepdown transformer 145D output will go to the converter 165B to change the AC voltage to DC voltage in order to initialize the Insulation Resistance (IR) tester 125B, making it ready to start the insulation test on the bushing 110B. The result of the insulation test can be recorded in the microcontroller 160C. The microcontroller 160C can provide the results to PLC 132 through its input port IN4 and similarly, can provide the result to PLC 133 through its input port IN4.

As noted, the result of the IR test can be provided in the form of a ratio of the resistance of the bushing (M$\Omega$). Determining whether the insulation properties of the bushing are acceptable or failing can comprise determining whether the measured IR test result exceeds a Minimum Accepted Value of Insulation (MAV). MAV can be defined according to the equation:

Minimum Accepted Value (MAV)=1 M$\Omega$ Per 1 KV of applied voltage+1 M$\Omega$.

The health of the tested bushing can also be determined by calculating a Polarization-Index (PI) value and comparing the calculated PI value to a threshold PI value. PI can be calculated according to the equation:

PI=IR test result after 10 min/IR test result after one min.

In an embodiment, the PI value can be considered acceptable if PI is greater than two (2).

Table 2, shown below, illustrates three exemplary operational scenarios depending on the value X of the IR test result, the corresponding health of the tested bushing as determined by the PLC(s) based on a comparison of X with the MAV, and any further action(s) that could be performed or initiated by the PLC(s) in connection with each scenario.

TABLE 2

| # | IR Test | Bushing Healthiness | Action Taken |
|---|---------|---------------------|--------------|
| 1 | X > MAV | Good | PI test will be conducted to enhance the IR result. Then, the central & local LCDs will show" main/backup bushing insulation is good with result value and it is ready to back to the service ". |
| 2 | X = MAV | Fair/poor | PI test will be conducted automatically. If the PI value is greater than 2, the central & local LCD will show" main/backup bushing insulation is fair with result value and it can be back to the service if the need is necessary" but both IR & PI test will be conducted semimonthly. If the PI value is less than 2 the bushing will be isolated from the circuit till be replaced by new one. The central & local LCD will show" main/backup bushing insulation is poor" and the alarm will be shown in central & local LCD. |
| 3 | X < MAV | Poor | It will show in the central & local LCD" main/backup bushing# insulation is Poor " and PI test will be conducted automatically if it is less than 2, the tested bushing will be isolated until it replaced by new one and the alarm will be shown in central & local LCD. |

Table 3, shown below, illustrates three exemplary operational scenarios depending on the value generated by the PI test result, the corresponding health of the tested bushing (e.g., bushing 110A or 110B) as determined by the PLC(s) (e.g., PLCs 131, 132 and 133) based on the calculated PI test result values, and any further action(s) that would be performed or initiated by the PLC(s) in connection with a respective scenario.

TABLE 3

| # | PI Test Polarization-Index Val. | Bushing Healthiness | Action Taken |
|---|----------------------------------|---------------------|--------------|
| 1 | Above 2.0 | Good | The central &local LCDs will show the value of the PI test result with the condition of the bushing shown as "Good" and recommend to put the bushing into service. |
| 2 | Equal 2 | Fair | Although a rare occasion, the central &local LCDs will show the value of the PI test result with condition of the bushing shown as "Fair," and recommend to put the bushing into service if necessary; additionally the system will conduct a test semiannually. |
| 3 | From 1.0 to 2 | Poor | The central &local LCDs will show the value of the PI test result with condition of the bushing shown as "Poor," indicate an alarm; additionally the system will isolate the bushing from the circuit until it is replaced |

Figure 3A:
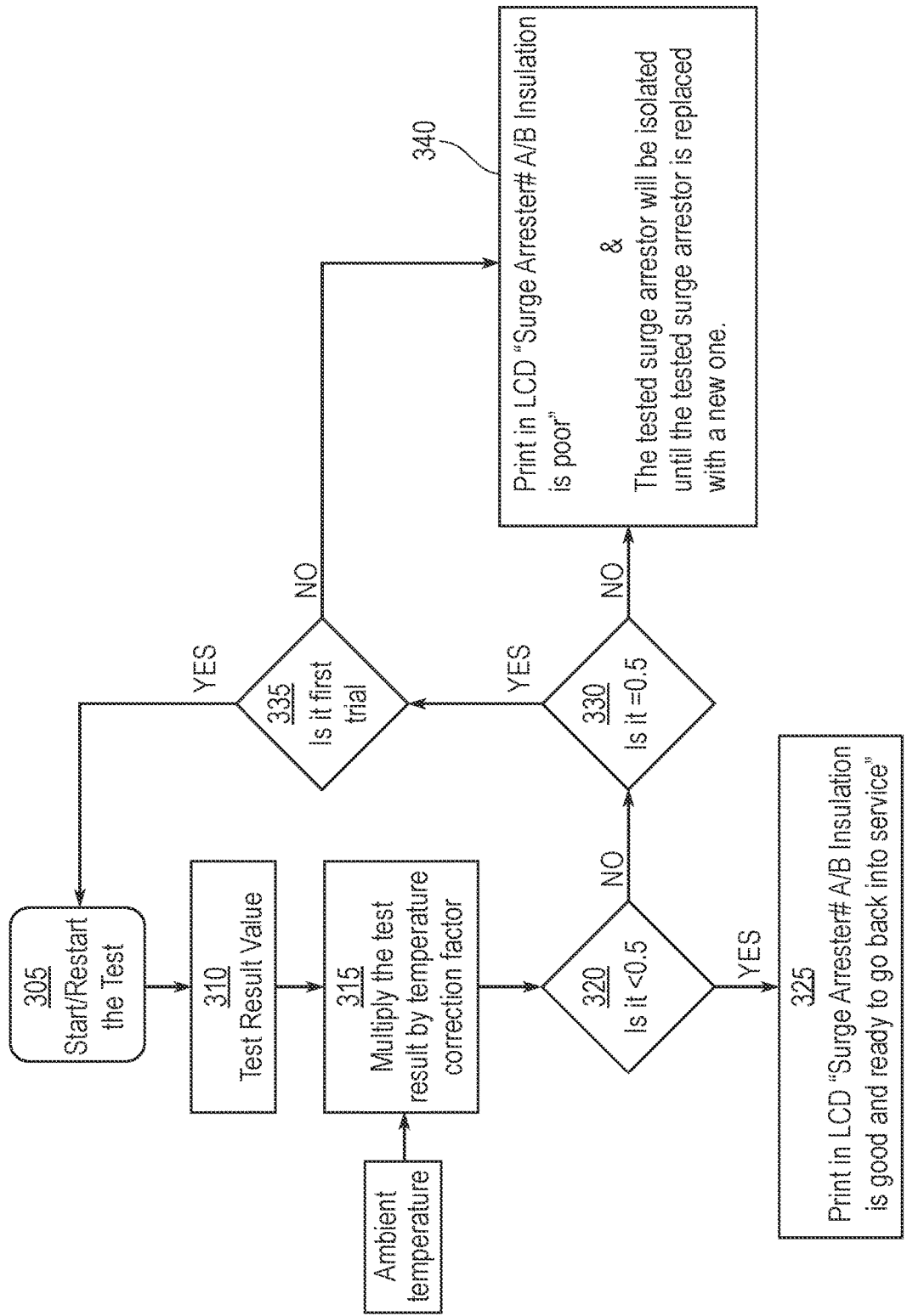
FIG. 3A is a flow diagram of an exemplary method for testing the insulation of a surge arrester of the protection circuit of FIG. 2A, according to an embodiment.
Figure 3B:
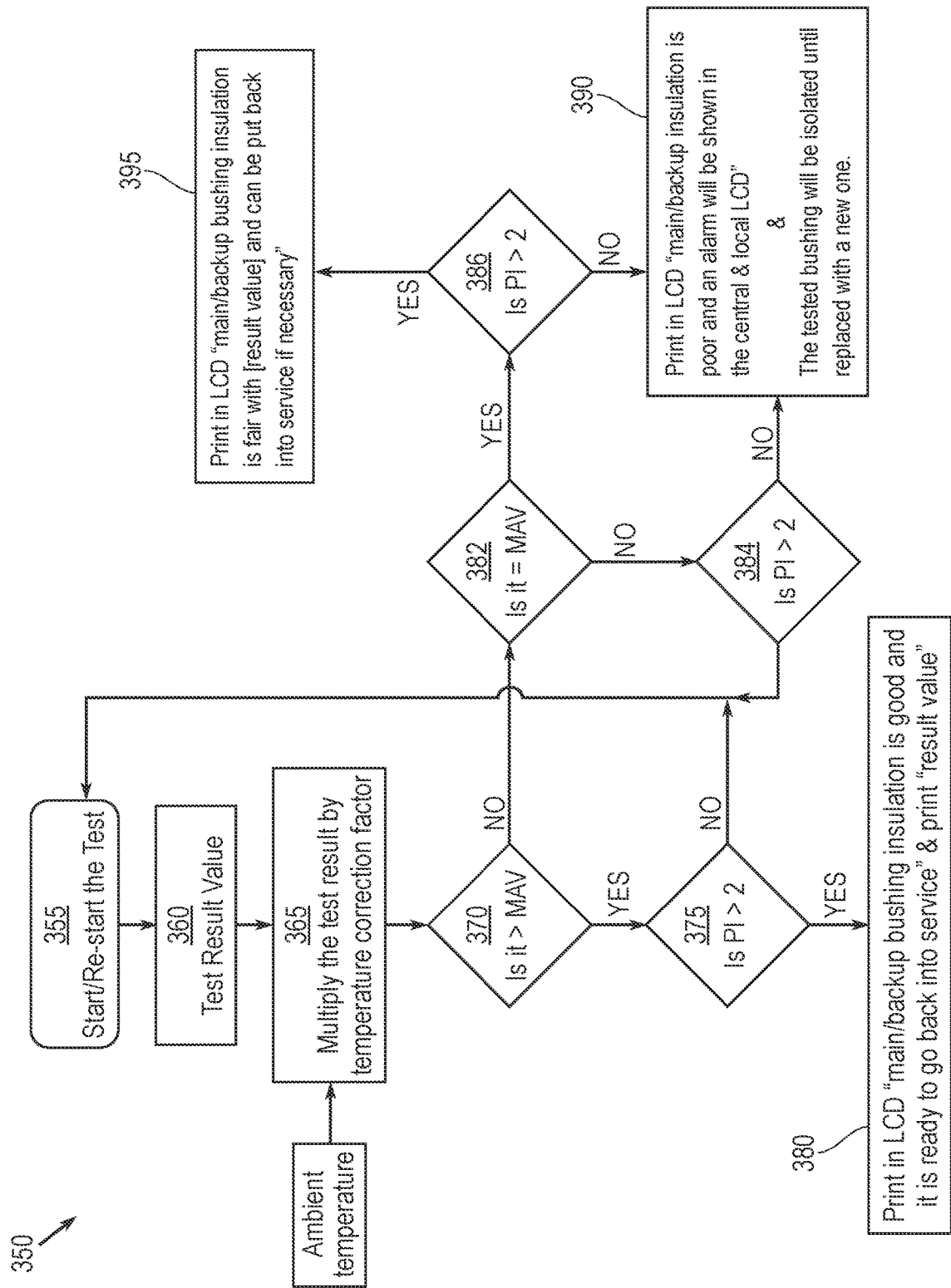
FIG. 3B is a flow diagram of an exemplary method for testing the insulation of a surge arrester of the protection circuit of FIG. 2A, according to an embodiment.

To recap, FIGS. 3A-3B are flow diagrams illustrating exemplary processes for testing the insulation status of surge arresters and bushings of the protection circuit 100. FIG. 3A is a flow diagram of an example method 300 for testing one of the surge arresters 105A or 105B using the protection circuit 100. The method starts at step 305. At step 310, a Tan Delta test is performed on a surge arrester and the result value is obtained. At step 315, the result value is multiplied by the appropriate temperature correction factor. At step 320, the corrected result is compared to a threshold level (e.g., 0.5). If the corrected result it is below the threshold level, at step 325, a passing status of the surge arrester can be output by the controller for display on one or more display devices. For instance, an LCD can display "Surge arrester A/B insulation is good and tested surge arrester is ready for service." If it is determined at step 330 that the corrected result is equal to the threshold level, and if it is determined at step 335 that the corrected result was from a first trial of the surge arrester, then the testing process 300 can be repeated starting at step 305. If it is determined from step 320 and 330 that the corrected result is greater than the threshold, or if it is determined at step 335 that the corrected result was not from a first trial of the surge arrester (e.g., from a second trial), then at step 340, a failing status of the surge arrester can be output for display on one or more display devices (e.g., LCD displays "Surge arrester A/B insulation is poor and tested surge arrester will be isolated until replaced").

FIG. 3B is a flow diagram of an example method 350 for testing one of the bushings 110A or 110B using the protection circuit 100. The method starts at step 355. At step 360, a result value of the IR Test performed on a bushing is obtained. At step 365, the IR result value is multiplied by the appropriate temperature correction factor. At step 370, corrected result is compared to a prescribed MAV threshold value. At step 375 a PI value calculated from the corrected result is compared to a prescribed PI threshold value.

If the corrected result exceeds the threshold MAV level and calculated PI is greater than the threshold PI level, then, at step 380, a passing status of the bushing is output for display on one or more display devices (e.g., an LCD displays result value and status message "Main/Backup bushing insulation is good and is ready for service").

If, it is determined at step 375 that the calculated PI result is less than or equal to the threshold PI level, then the testing process 350 is repeated starting at step 355. Additionally, if it is determined from steps 370 and 382 that the corrected result is less than the threshold MAV level, and if the calculated PI result is greater than the threshold PI level (step 384), then the testing process 350 is repeated starting at step 355.

If, it is determined from steps 370 and 382 that the corrected result is less than the threshold MAV level, and if the calculated PI result is not greater than the threshold PI level (step 384), then, at step 390 a failing status of the bushing is output for display on one or more display devices (e.g., LCD displays "Main/Backup bushing insulation is poor, alarm will be output, and tested bushing will be isolated until replaced").

If, it is determined at step 382 that the corrected result is equal to the threshold MAV level, and if the calculated PI result is not greater than the threshold PI level (step 386), then, at step 390, a failing status of the bushing is output for display on one or more display devices (e.g., LCD displays "Main/Backup bushing insulation is poor, alarm will be output, and tested bushing will be isolated until replaced").

If, it is determined at step 382 that corrected result is equal to the threshold MAV level, and if the calculated PI result is greater than the threshold PI level (step 386), then, at step 395, a "fair" status of the bushing is output for display on one or more display devices (e.g., LCD displays result values and message "Main/Backup bushing insulation is fair, and tested bushing can be put back into service if necessary").

Portions of these and other methods disclosed herein can be performed on or using a custom or preprogrammed logic device, circuit, or processor, such as a programmable logic circuit (PLC), computer, software, or other circuit (e.g., ASIC, FPGA) configured by code or logic to carry out their assigned task. The device, circuit, or processor can be, for example, a dedicated or shared hardware device (such as a laptop, a single board computer (SBC), a workstation, a tablet, a smartphone, part of a server, or a dedicated hardware circuit, as in an FPGA or ASIC, or the like), or computer server, or a portion of a server or computer system. The device, circuit, or processor can include a non-transitory computer readable medium (CRM, such as read-only memory (ROM), flash drive, or disk drive) storing instructions that, when executed on one or more processors, cause portions of the disclosed methods to be carried out. It should be noted that in other embodiments, the order of the operations can be varied, and that some of the operations can be omitted.

Table 4, which is provided below, lists the electrical contacts of the exemplary protection circuit 100 including a respective default status and respective function of same when transitioned away from the default state (e.g., opened if normally closed, or, closed if normally open).

TABLE 4

| Contact | Status in Default Mode | Function (when transitioned from its default mode) |
|---|---|---|
| C1 | Normally closed | Isolating the surge arrester A (105A) |
| C2 | Normally closed | Isolating the surge arrester B (105B) |
| C3 | Normally opened | Starting the tan delta test for the surge arrester A (105A) |
| C4 | Normally opened | Starting the tan delta test for the surge arrester B (110B) |
| C5 | Normally closed | Isolating the main bushing (110A) from the circuit |
| C6 | Normally opened | Isolating the backup bushing (110B) from the circuit |
| C7 | Normally opened | Starting the IR test for the main bushing (110A) |
| C8 | Normally opened | Starting the IR test for the main bushing (110A) |
| C9 | Normally opened | Starting the IR test for the backup bushing (110B) |
| C10 | Normally opened | Starting the IR test for the backup bushing (110B) |
| C11 | Normally closed | Isolating the main bushing (110A) |
| C12 | Normally opened | Isolating the backup bushing (110B) |

As described above, in an embodiment, the status of contacts C1-C12 are respectively controlled by an output of a controller device, such as one or more of PLCs 131, 132 and 133. In an embodiment, the PLCs can be configured to generate suitable digital logic signals that are output from respective outputs to control operation of the contacts. The outputs can include a "0," representing a logic low signal, and "1" representing a logic high signal. In an embodiment, a PLC output of 0 will not change the status of an associated contact, and will keep the status of that associated contact in the default mode. A PLC output of 1 will change the status of the associated contact from closed to opened or opened to closed, thereby changing the status of the contact from its default mode.

FIG. 4 is a table 400 listing various event types relating to the measured status of the surge arresters and bushings. For each system event, the table also specifies the relationship between the outputs of PLC 1 (i.e., PLC 131), PLC 2 (i.e., PLC 132) and PLC 3 (i.e., PLC 133) and the status of the main contacts (C1, C2, C5, C6, C11 and C12) that are responsible for selectively isolating the surge arresters and bushings as a function of the arrester and/or bushing status.

Figure 5:
FIG. 5 is a state table listing the relationship between the status of electrical contacts and the outputs generated by the controllers for a variety of insulation test scenarios, according to an embodiment.

FIG. 5 is a table 500 listing the relationship between the status of the electrical contacts of protection circuit 100 and the output that is generated for each output of the PLCs 131, 132 and 133 due to various insulation test scenarios. For example, each row among rows #1-8, includes: a) a combination of possible states or results for the Tan Delta test of surge arrester 105A, the Tan Delta test of surge arrester 105B, the IR/PI test results of main bushing 110A and the IR/PI test results of backup bushing 110B; b) the respective outputs/actions for each of PLC 131, 132 and 133; and c) the corresponding state of the contacts C1-C12. In particular, the table shows the value for each of outputs 1-output 6 for PLC 131 and PLC 132, as well as the value of outputs 1-3 for PLC 133. Furthermore, as illustrated in the legend of FIG. 5, the cells representing the state of contacts C1-C12 (e.g., 1 or 0) are also patterned in a manner that represents the status of a corresponding surge arrester or bushing. For instance, in row #4 of the table in FIG. 5, the cells for C1, C5 and C11 indicate that C1 and C5 are open (i.e., state "1") and patterned to indicate that surge arrester 105A has insulation failure. C11, which is for isolating the main bushing 110A, is also shown as being open (i.e., state "1") and patterned to indicate that bushing 110A has an insulation failure.

As noted, the protection circuit 100 can be operatively connected to a central PLC 190 and the result of the insulation tests and other information relating to the status of the various components of the protection circuit 100 can be output by the PLC 190 using a display, such as an LCD display, that is operatively connected thereto. For example, FIG. 6 depicts a screen shot of an exemplary display screen 600 outputting information concerning operation of the protection circuit 100. Display screen 600 can be operatively connected to a computing device (e.g., central PLC 190) which is monitoring the protection circuit(s) 100. As shown, the information displayed on the screen can include, for example and without limitation, a history of previous insulation tests 610 for both surge arresters and bushings of the protection circuit, the testing criteria 615 (e.g., prescribed threshold/target parameter values for IR and Tan Delta tests) used in the tests for classifying the condition of the surge arresters/bushings, as well as the status 605 of the insulation of the of the surge arresters/bushings and any alarm conditions.

Figure 7A:
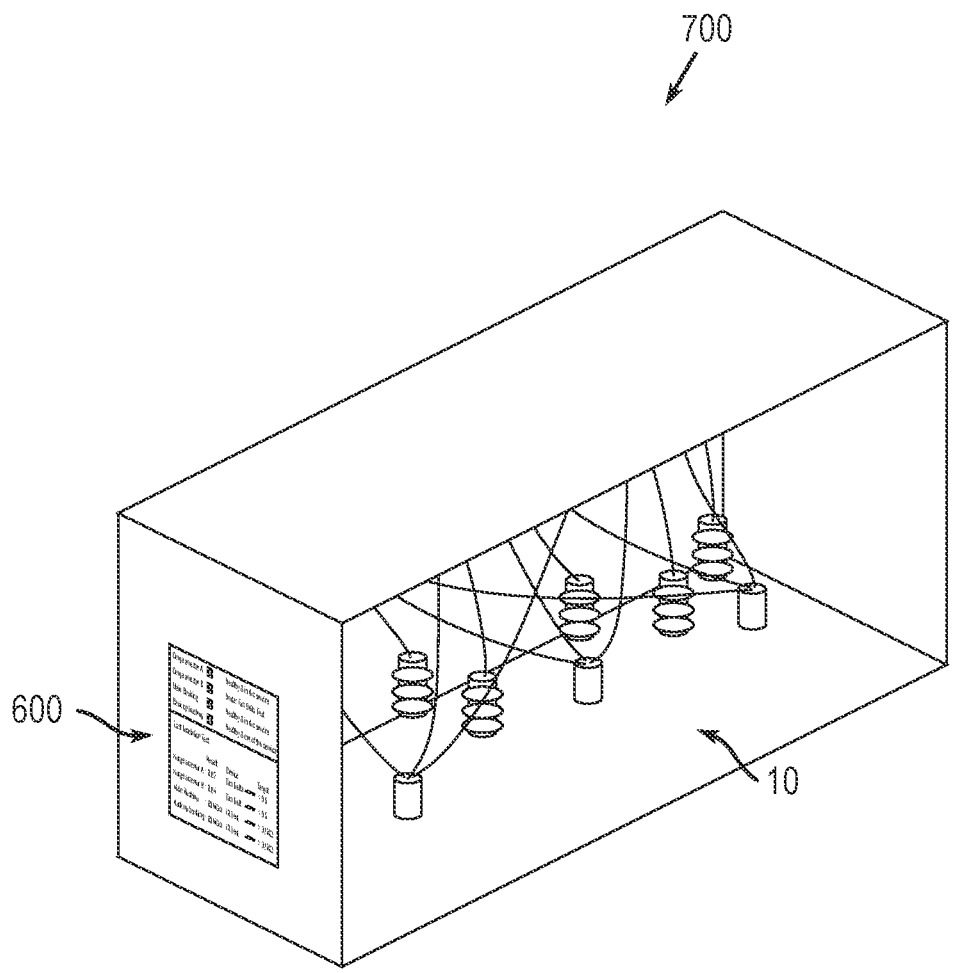
FIG. 7A illustrates an exemplary junction box hosing an over-voltage protection solution, according to an embodiment.
Figure 7B:
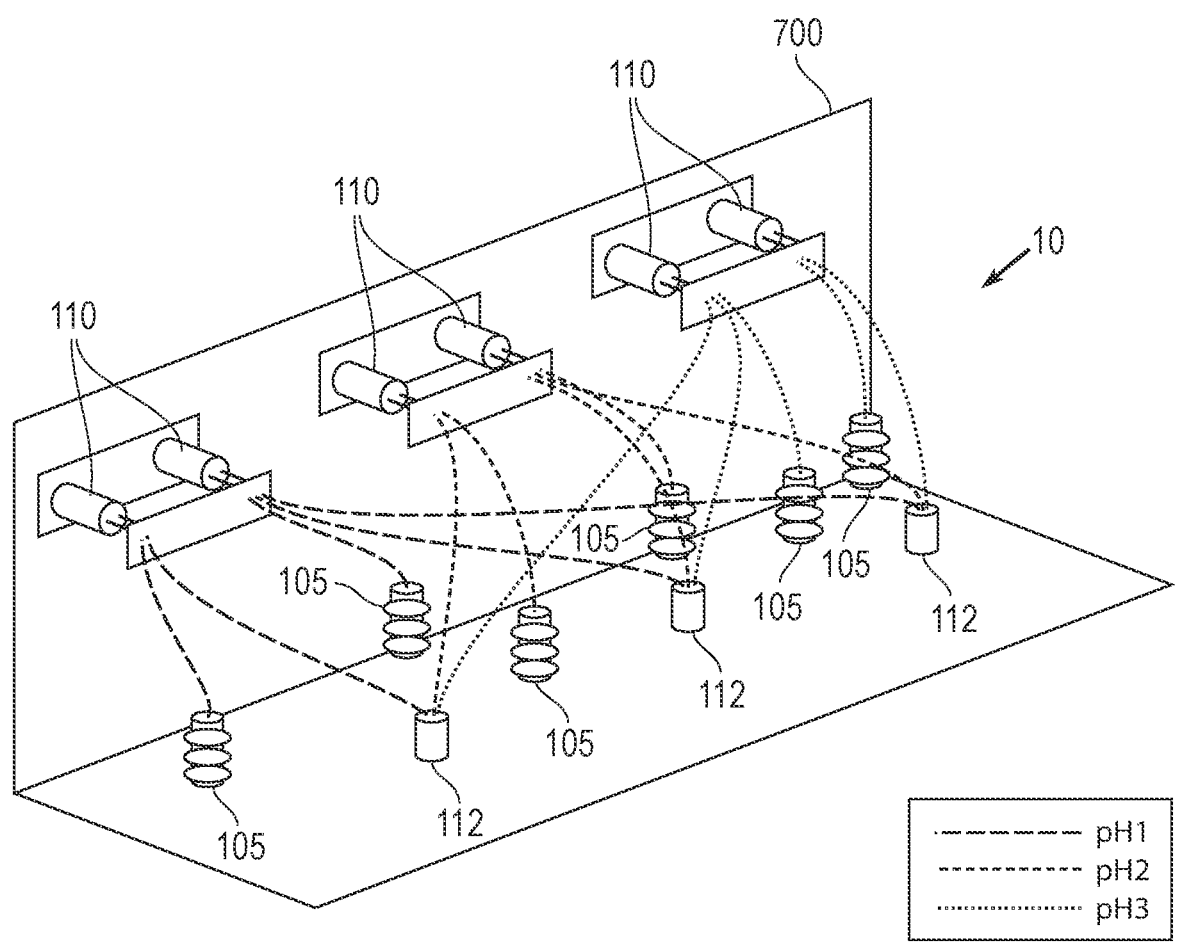
FIG. 7B illustrates the junction box of FIG. 7A with a top wall and end walls removed.

In some embodiments, the over-voltage protection system 10 can be housed in one or more housings, such as an electrical junction box. For instance, FIG. 7A is a perspective view diagram of a junction box 700 shown with a front panel of the junction box removed. The junction box 700 is configured to house the over-voltage protection system 10, which comprises three protection circuits 100 for respective phases of the three-phase power provided to electrical equipment (not shown). Although not shown, the junction box 700 can include electrical connectors and other such components suitable for connecting the overvoltage protection system 10 to the power source and outputting power to the electrical equipment 20 (not shown). As shown, the exemplary junction box 700 can be configured to include, on an exterior surface of the box, the LCD screen 600 for displaying the status of various components of the one or more protection circuits. FIG. 7B illustrates the junction box 700 with the top wall and two side/end walls removed to show only the bottom and back walls and components of the over-voltage protection system 10 housed within the junction box. More specifically, the components shown in the junction box include bushings 110 for each of the three phases ph1, ph2 and ph3, a busbar associated with each of the bushings, and conductive lines that lead from the busbars to each of several surge arrestors 105 and, in parallel, to a power connection 112.

The methods described herein may be performed in part or in full by software or firmware in machine readable form on a tangible (e.g., non-transitory) storage medium. For example, the software or firmware may be in the form of a computer program including computer program code adapted to perform some or all of the steps of any of the methods described herein when the program is run on a computer or suitable hardware device (e.g., FPGA), and where the computer program may be embodied on a computer readable medium. Examples of tangible storage media include computer storage devices having computer-readable media such as disks, thumb drives, flash memory, and the like, and do not include propagated signals. Propagated signals may be present in a tangible storage media, but propagated signals by themselves are not examples of tangible storage media. The software can be suitable for execution on a parallel processor or a serial processor such that the method steps may be carried out in any suitable order, or simultaneously.

It is to be further understood that like or similar numerals in the drawings represent like or similar elements through the several figures, and that not all components or steps described and illustrated with reference to the figures are required for all embodiments or arrangements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing and are not to be construed as limiting. However, it is recognized these terms could be used with reference to a viewer. Accordingly, no limitations are implied or to be inferred. In addition, the use of ordinal numbers (e.g., first, second, third) is for distinction and not counting. For example, the use of "third" does not imply there is a corresponding "first" or "second." Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The terms "a," "an," and "the," as used in this disclosure, means "one or more," unless expressly specified otherwise.

The term "communicating device," as used in this disclosure, means any hardware, firmware, or software that can transmit or receive data packets, instruction signals or data signals over a communication link. The communicating device can include a computer or a server. The communicating device can be portable or stationary.

The term "communication link," as used in this disclosure, means a wired or wireless medium that conveys data or information between at least two points. The wired or wireless medium can include, for example, a metallic conductor link, a radio frequency (RF) communication link, an Infrared (IR) communication link, or an optical communication link. The RF communication link can include, for example, Wi-Fi, WiMAX, IEEE 802.11, DECT, 0G, 1G, 2G, 3G, 4G or 5G cellular standards, or Bluetooth.

The terms "computer" or "computing device," as used in this disclosure, means any machine, device, circuit, component, or module, or any system of machines, devices, circuits, components, or modules which are capable of manipulating data according to one or more instructions, such as, for example, without limitation, a processor, a microprocessor, a graphics processing unit, a central processing unit, a general purpose computer, a super computer, a personal computer, a laptop computer, a palmtop computer, a notebook computer, a desktop computer, a workstation computer, a server, a server farm, a computer cloud, or an array of processors, microprocessors, central processing units, general purpose computers, super computers, personal computers, laptop computers, palmtop computers, notebook computers, desktop computers, workstation computers, or servers.

The term "computer-readable medium," as used in this disclosure, means any storage medium that participates in providing data (for example, instructions) that can be read by a computer. Such a medium can take many forms, including non-volatile media and volatile media. Non-volatile media can include, for example, optical or magnetic disks and other persistent memory. Volatile media can include dynamic random access memory (DRAM). Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave, or any other medium from which a computer can read. The computer-readable medium can include a "Cloud," which includes a distribution of files across multiple (for example, thousands of) memory caches on multiple (for example, thousands of) computers.

Various forms of computer readable media can be involved in carrying sequences of instructions to a computer. For example, sequences of instruction (i) can be delivered from a RAM to a processor, (ii) can be carried over a wireless transmission medium, or (iii) can be formatted according to numerous formats, standards or protocols, including, for example, Wi-Fi, WiMAX, IEEE 802.11, DECT, 0G, 1G, 2G, 3G, 4G, or 5G cellular standards, or Bluetooth.

The term "database," as used in this disclosure, means any combination of software or hardware, including at least one application or at least one computer. The database can include a structured collection of records or data organized according to a database model, such as, for example, but not limited to at least one of a relational model, a hierarchical model, or a network model. The database can include a database management system application (DBMS) as is known in the art. The at least one application may include, but is not limited to, for example, an application program that can accept connections to service requests from clients by sending back responses to the clients. The database can be configured to run the at least one application, often under heavy workloads, unattended, for extended periods of time with minimal human direction.

The terms "including," "comprising" and their variations, as used in this disclosure, mean "including, but not limited to," unless expressly specified otherwise.

The term "network," as used in this disclosure means, but is not limited to, for example, at least one of a local area network (LAN), a wide area network (WAN), a metropolitan area network (MAN), a personal area network (PAN), a campus area network, a corporate area network, a global area network (GAN), a broadband area network (BAN), a cellular network, or the Internet, any of which can be configured to communicate data via a wireless or a wired communication medium. These networks can run a variety of protocols not limited to TCP/IP, IRC or HTTP.

The term "server," as used in this disclosure, means any combination of software or hardware, including at least one application or at least one computer to perform services for connected clients as part of a client-server architecture. The at least one server application can include, but is not limited to, for example, an application program that can accept connections to service requests from clients by sending back responses to the clients. The server can be configured to run the at least one application, often under heavy workloads, unattended, for extended periods of time with minimal human direction. The server can include a plurality of computers configured, with the at least one application being divided among the computers depending upon the workload. For example, under light loading, the at least one application can run on a single computer. However, under heavy loading, multiple computers can be required to run the at least one application. The server, or any if its computers, can also be used as a workstation.

The term "transmission," as used in this disclosure, means the conveyance of signals via electricity, acoustic waves, light waves and other electromagnetic emissions, such as those generated with communications in the radio frequency (RF) or infrared (IR) spectra. Transmission media for such transmissions can include coaxial cables, copper wire and fiber optics, including the wires that comprise a system bus coupled to the processor.

Devices that are in communication with each other need not be in continuous communication with each other unless expressly specified otherwise. In addition, devices that are in communication with each other may communicate directly or indirectly through one or more intermediaries.

Although process steps, method steps, or algorithms may be described in a sequential or a parallel order, such processes, methods and algorithms may be configured to work in alternate orders. In other words, any sequence or order of steps that may be described in a sequential order does not necessarily indicate a requirement that the steps be performed in that order; some steps may be performed simultaneously. Similarly, if a sequence or order of steps is described in a parallel (or simultaneous) order, such steps can be performed in a sequential order. The steps of the processes, methods or algorithms described in this specification may be performed in any order practical.

When a single device or article is described, it will be readily apparent that more than one device or article may be used in place of a single device or article. Similarly, where more than one device or article is described, it will be readily apparent that a single device or article may be used in place of the more than one device or article. The functionality or the features of a device may be alternatively embodied by one or more other devices which are not explicitly described as having such functionality or features.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, and by structures and functions or steps which are equivalent to these recitations.

What is claimed is:

1. An over-voltage protection system for protecting electrical equipment from over-voltage transients from a power source, the system comprising:
   a protection circuit comprising:
      a first electrical bus, wherein the first electrical bus is energized by the power source;
      a second electrical bus configured to feed power to the electrical equipment;
      a first surge arrester and a second surge arrester arranged in parallel, the first surge arrester having one end electrically connected to the first electrical bus via first normally closed contact and having an opposite end connected to ground, the second surge arrester having one end electrically connected to the first electrical bus via a second normally closed contact and having and an opposite end connected to ground;
      a main bushing and a backup bushing, wherein the main bushing is connected between the first electrical bus and the second electrical bus by a third normally closed contact, wherein the backup bushing is connected between the first electrical bus and the second electrical bus by a first normally open contact, wherein the first normally open contact is provided in series with the backup bushing and configured to isolate the backup bushing from at least one of the first electrical bus and the second electrical bus while in an open state and is configured to electrically connect the backup bushing to the one or more of the first electrical bus and the second electrical bus when in a closed state; and
   a controller configured to selectively open or close one or more of the first normally closed contact, the second normally closed contact, the third normally closed contact, and the first normally open contact, and wherein the controller is configured to:
      selectively isolate the first surge arrester and thereby remove it from service in the protection circuit by opening the first normally closed contact,
      selectively isolate the second surge arrester and thereby remove it from service in the protection circuit by opening the second normally closed contact,
      selectively isolate the main bushing and thereby remove it from service in the protection circuit by opening the third normally closed contact, and
      selectively place the backup bushing into service in the protection circuit by closing the first normally open contact thereby electrically connecting the backup bushing to the first electrical bus and the second electrical bus.

2. The system of claim 1, further comprising:
   a tan delta tester operatively connected to the controller and configured to test an insulation property of one or more of the first surge arrester and the second surge arrester; and an Insulation Resistance (IR) tester operatively connected to controller and configured to test an insulation property of one or more of the main bushing and the backup bushing.

3. The system of claim 2, wherein the controller is configured to measure the insulation property of a given surge arrester among the first surge arrester and second surge arrester individually, and
wherein, prior to measuring the insulation property of the given surge arrester, the controller is configured to isolate the given surge arrester from the protection circuit, while maintaining another surge arrester among the first and second surge arresters in service in the protection circuit.

4. The system of claim 3, wherein the controller is configured to measure the insulation property of a given bushing among the main bushing and the backup bushing individually using the IR tester, and
wherein, prior to measuring the insulation property of the given bushing using the IR tester, the controller is configured to remove the given bushing from service, and place the other bushing among the main bushing and the backup bushing into service in the protection circuit.

5. The system of claim 4,
wherein the IR tester measures a ratio of a resistance of the given bushing, and wherein the controller is configured to calculate a Polarization Index (PI) value from the IR tester measurement, and wherein the controller is configured to determine a status of the given bushing's insulation by comparing the ratio measured by the IR tester to a prescribed Minimum Accepted Value of Insulation (MAV) and by comparing the calculated PI value to a prescribed PI threshold, and
wherein the tan delta tester is configured to measure a ratio of a resistance of the given surge arrester divided by a capacitance of the given surge arrester, and wherein the controller is configured to determine a status of the given surge arrester's insulation by comparing the ratio measured by the tan delta tester to a prescribed threshold ratio.

6. The system of claim 5, wherein in response to determining that the status of the given surge arrester's insulation is poor, the controller is configured to isolate the given surge arrester from the protection circuit, and maintain the other surge arrester among the first and second surge arrester in service, and wherein in response to determining that the status of the given bushing's insulation is poor, the controller is configured to isolate the given bushing from the protection circuit and maintain the other bushing among the main bushing and the backup bushing in service.

7. The system of claim 4,
wherein the main bushing is arranged in series between the third normally closed contact and a fourth normally closed contact, and wherein the controller is configured to selectively isolate the main bushing by opening the third and fourth normally closed contacts, and
wherein the backup bushing is arranged in series between the first normally open contact and a second normally open contact, and wherein the controller is configured to electrically connecting the backup bushing to the first electrical bus and the second electrical bus by closing the first and second normally open contacts and thereby placing the backup bushing into service in the protection circuit.

8. The system of claim 5, further comprising:
one or more temperature sensors configured to measure an ambient temperature, wherein the controller is configured to adjust the Tan Delta tester measurement and the IR tester measurement as a function of the ambient temperature.

9. The system of claim 5, further comprising:
a monitoring computing system in communication with the controller, wherein the controller is configured to output the determined status of the given surge arrester's insulation and the determined status of the given bushing's insulation; and
a display in communication with the controller, wherein the controller is configured to output via the display, the determined status of the given surge arrester's insulation and the determined status of the given bushing's insulation.

10. The system of claim 1, further comprising:
a plurality of protection circuits,
wherein the plurality of protection circuits are each configured to receive a respective phase of the power from the power source and supply the respective phase of the power to the equipment.

11. A method of protecting electrical equipment from over-voltage transients from a power source using an over-voltage protection system, the method comprising:
protecting a protection circuit comprising:
a first electrical bus, wherein the first electrical bus is energized by the power source;
a second electrical bus configured to feed power to the electrical equipment;
a first surge arrester and a second surge arrester arranged in parallel, the first surge arrester having one end electrically connected to the first electrical bus via first normally closed contact and having an opposite end connected to ground, the second surge arrester having one end electrically connected to the first electrical bus via a second normally closed contact and having and an opposite end connected to ground;
a main bushing and a backup bushing, wherein the main bushing is connected between the first electrical bus and the second electrical bus by a third normally closed contact, wherein the backup bushing is connected between the first electrical bus and the second electrical bus by a first normally open contact, wherein the first normally open contact is provided in series with the bushing and configured to isolate the backup bushing from at least one of the first electrical bus and the second electrical bus while in an open state and is configured to electrically connect the backup bushing to the one or more of the first electrical bus and the second electrical bus when in a closed state;
a controller configured to selectively open or close one or more of the first normally closed contact, the second normally closed contact, the third normally closed contact, and the first normally open contact; and
a tan delta tester operatively connected to the controller and configured to test an insulation property of one or more of the first surge arrester and the second surge arrester, and an Insulation Resistance (IR) tester operatively connected to controller and configured to test an insulation property of one or more of the main bushing and the backup bushing;

periodically measuring, by the controller using the tan delta tester, the insulation property of each of the first and second surge arresters individually, wherein measuring the insulation property of a given surge arrester among the first surge arrester and second surge arrester includes:
  isolating, by the controller, the given surge arrester from the protection circuit, and maintaining another surge arrester among the first and second surge arresters in service in the protection circuit while the given surge arrester is isolated, wherein the first surge arrester is isolated by opening the first normally closed contact and the second surge arrester is isolated by opening the second normally closed contact,
  measuring, by the controller using the tan delta tester, the insulation property of the given surge arrester, and
  determining, by the controller, a status of the given surge arrester's insulation based on the measured insulation property;
in response to determining that the status of the given surge arrester's insulation is acceptable,
  placing, by the controller, the given surge arrester back into service, wherein the first surge arrester is placed back into service by closing the first normally closed contact, and wherein the second surge arrester is placed back into service by closing the second normally closed contact; and
in response to determining that the status of the given surge arrester's insulation is poor,
  outputting, by the controller, an alarm indicating the status of the given bushing, and
  maintaining the given surge arrester in an out of service state.

12. The method of claim 11, wherein the step of measuring the insulation property of the given surge arrester comprises measuring a ratio of a resistance of the given surge arrester divided by a capacitance of the given surge arrester, and wherein the status of the given surge arrester's insulation is determined by comparing the measured ratio to a prescribed threshold ratio.

13. The method of claim 11, further comprising:
  periodically measuring, by the controller using the IR tester, the insulation property of the main bushing, wherein measuring the insulation property of the main bushing includes:
    prior to measuring the insulation property of the main bushing,
      isolating the main bushing from the protection circuit by opening the third normally closed contact and thereby removing the main bushing from service in the protection circuit, and
      electrically connecting the backup bushing to the first electrical bus and the second electrical bus by closing the first normally open contact and thereby placing the backup bushing into service in the protection circuit,
    measuring, with the IR tester, the insulation property of the main bushing,
    determining a status of the main bushing's insulation based on the measured insulation property of the main bushing;
  in response to determining that the status of the main bushing's insulation is acceptable,
    placing, by the surge arrester, the main bushing back into service by closing the third normally closed contact, and
    electrically isolating the backup bushing from the protection circuit by opening the first normally open contact and thereby removing the backup bushing from service in the protection circuit,
  in response to determining that the status of the main surge arrester's insulation is poor,
    outputting, by the controller, an alarm indicating the status of the main bushing, and
    maintaining the main surge arrester in an out of service state.

14. The method of claim 13, wherein the step of measuring the insulation property of the main bushing comprises:
  measuring, using the tan delta tester, a ratio of a resistance of the main bushing, and
  calculating, using the measured ratio, a Polarization Index (PI) value, and
  wherein the status of the main bushing's insulation is determined by comparing the ratio measured by the tan delta tester to a prescribed MAV and comparing the calculated PI value to a prescribed PI threshold.

15. The method of claim 11, wherein the main bushing is arranged in series between the third normally closed contact and a fourth normally closed contact, and wherein the controller is configured to selectively isolate the main bushing by opening the third and fourth normally closed contacts, and
  wherein the backup bushing is arranged in series between the first normally open contact and a second normally open contact, and wherein the controller is configured to electrically connect the backup bushing to the first electrical bus and the second electrical bus by closing the first and second normally open contacts and thereby placing the backup bushing into service in the protection circuit.

16. The method of claim 13, wherein the controller of the protection circuit is in operative communication with a display device, and the method further comprising:
  displaying, by the controller using the display, the determined status of the given surge arrester's insulation and the determined status of the main bushing's insulation, the measured insulation property of the first and second surge arresters and the measured insulation property of the main bushing.

* * * * *